United States Patent
Dunn et al.

(10) Patent No.: US 9,648,790 B2
(45) Date of Patent: May 9, 2017

(54) HEAT EXCHANGER ASSEMBLY FOR AN ELECTRONIC DISPLAY

(71) Applicant: Manufacturing Resources International, Inc., Alpharetta, GA (US)

(72) Inventors: William Dunn, Alpharetta, GA (US); Tim Hubbard, Alpharetta, GA (US); Kevin O'Connor, Duluth, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 231 days.

(21) Appl. No.: 14/198,141

(22) Filed: Mar. 5, 2014

(65) Prior Publication Data

US 2014/0314395 A1    Oct. 23, 2014

Related U.S. Application Data

(60) Provisional application No. 61/791,421, filed on Mar. 15, 2013.

(51) Int. Cl.
*H05K 7/20* (2006.01)
*G11B 33/06* (2006.01)

(52) U.S. Cl.
CPC ......... *H05K 7/20909* (2013.01); *G11B 33/06* (2013.01); *H05K 7/209* (2013.01); *H05K 7/20145* (2013.01); *H05K 7/20972* (2013.01)

(58) Field of Classification Search
CPC ........ G02F 1/133385; H05K 7/201918; H05K 7/20954; H05K 7/90272; H01L 23/467; F28F 3/02; F28F 3/025; F28F 3/027; F28F 3/08; F28F 3/14; F28D 9/0043; F28D 9/005
USPC ........ 361/695, 696, 697; 349/161; 165/80.3, 165/133

See application file for complete search history.

(56) References Cited

U.S. PATENT DOCUMENTS

| | | | | |
|---|---|---|---|---|
| 5,293,930 A | * | 3/1994 | Pitasi | H01L 23/367 165/185 |
| 5,535,816 A | * | 7/1996 | Ishida | F28F 3/02 165/104.33 |
| 5,765,743 A | * | 6/1998 | Sakiura | F24F 11/053 165/80.3 |
| 7,813,124 B2 | | 10/2010 | Karppanen | |
| 2002/0148600 A1 | | 10/2002 | Bosch | |
| 2009/0120629 A1 | | 5/2009 | Ashe | |

(Continued)

*Primary Examiner* — Tuan T Dinh
*Assistant Examiner* — Mukund G Patel
(74) *Attorney, Agent, or Firm* — Standley Law Group LLP

(57) ABSTRACT

The exemplary embodiments disclosed herein provide a heat exchanger assembly for cooling power module bricks, having a plurality of heat exchanger layers where a top layer is in conductive thermal communication with the power module brick. A series of metallic plates are preferably positioned within each heat exchanger layer and are preferably aligned with the power module brick. A circulating fan may be positioned to force circulating gas across the power module brick and through the heat exchanger. An external air fan may be positioned to force external air through the heat exchanger. Pass through junctions may be positioned near edges of the heat exchanger to permit the circulating gas to cross paths with the external air without allowing the two gas flows to mix with one another.

16 Claims, 6 Drawing Sheets

(56) References Cited

U.S. PATENT DOCUMENTS

| | | | |
|---|---|---|---|
| 2010/0321887 A1* | 12/2010 | Kwon | H05K 7/20972 361/695 |
| 2011/0001898 A1* | 1/2011 | Mikubo | G02F 1/133385 349/58 |
| 2011/0085301 A1 | 4/2011 | Dunn | |
| 2011/0261523 A1* | 10/2011 | Dunn | G02F 1/133308 361/679.21 |
| 2012/0006523 A1* | 1/2012 | Masahiro | B21C 23/14 165/185 |
| 2012/0012295 A1* | 1/2012 | Kakiuchi | B23P 15/26 165/185 |
| 2012/0012300 A1* | 1/2012 | Dunn | G02F 1/133385 165/287 |

\* cited by examiner

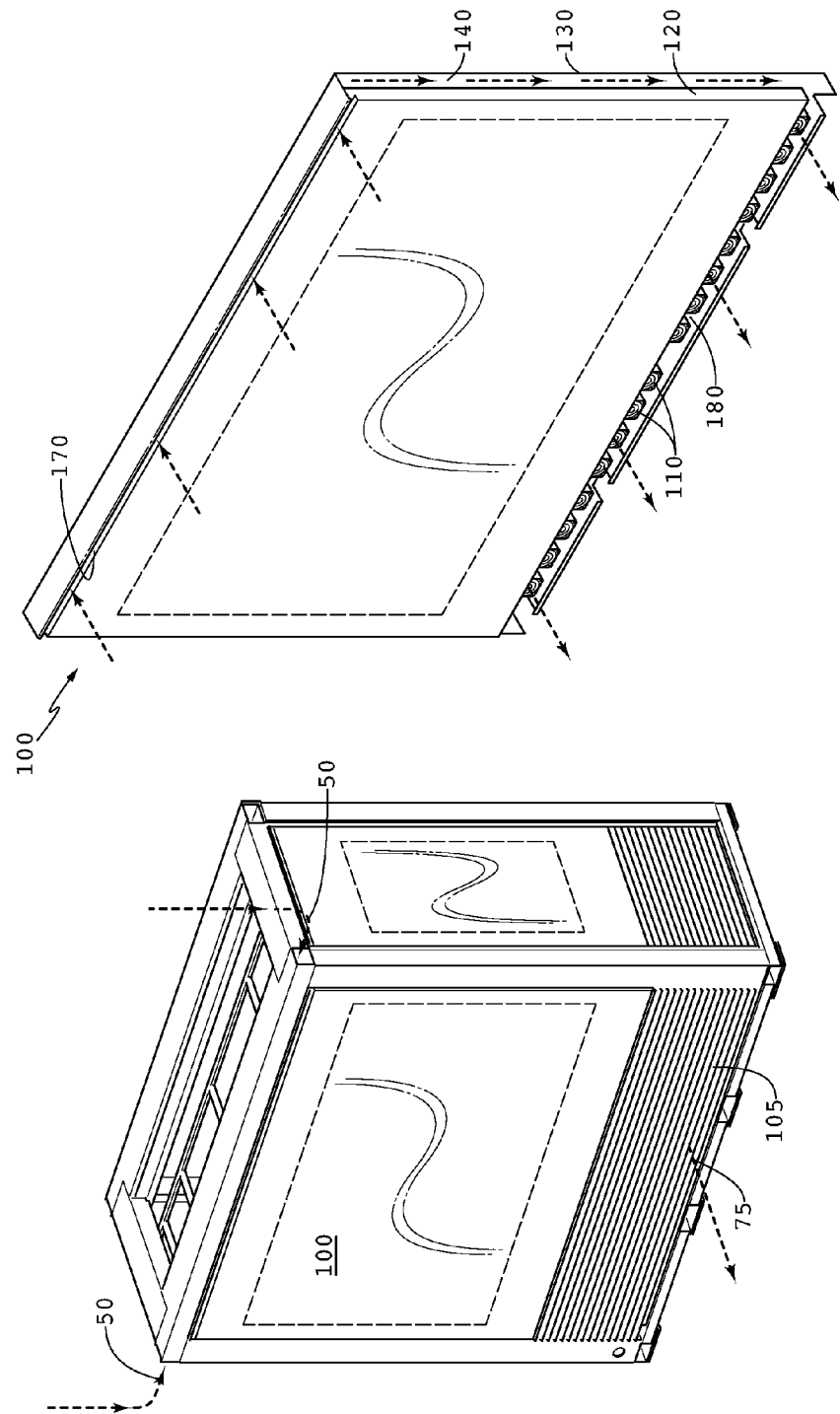

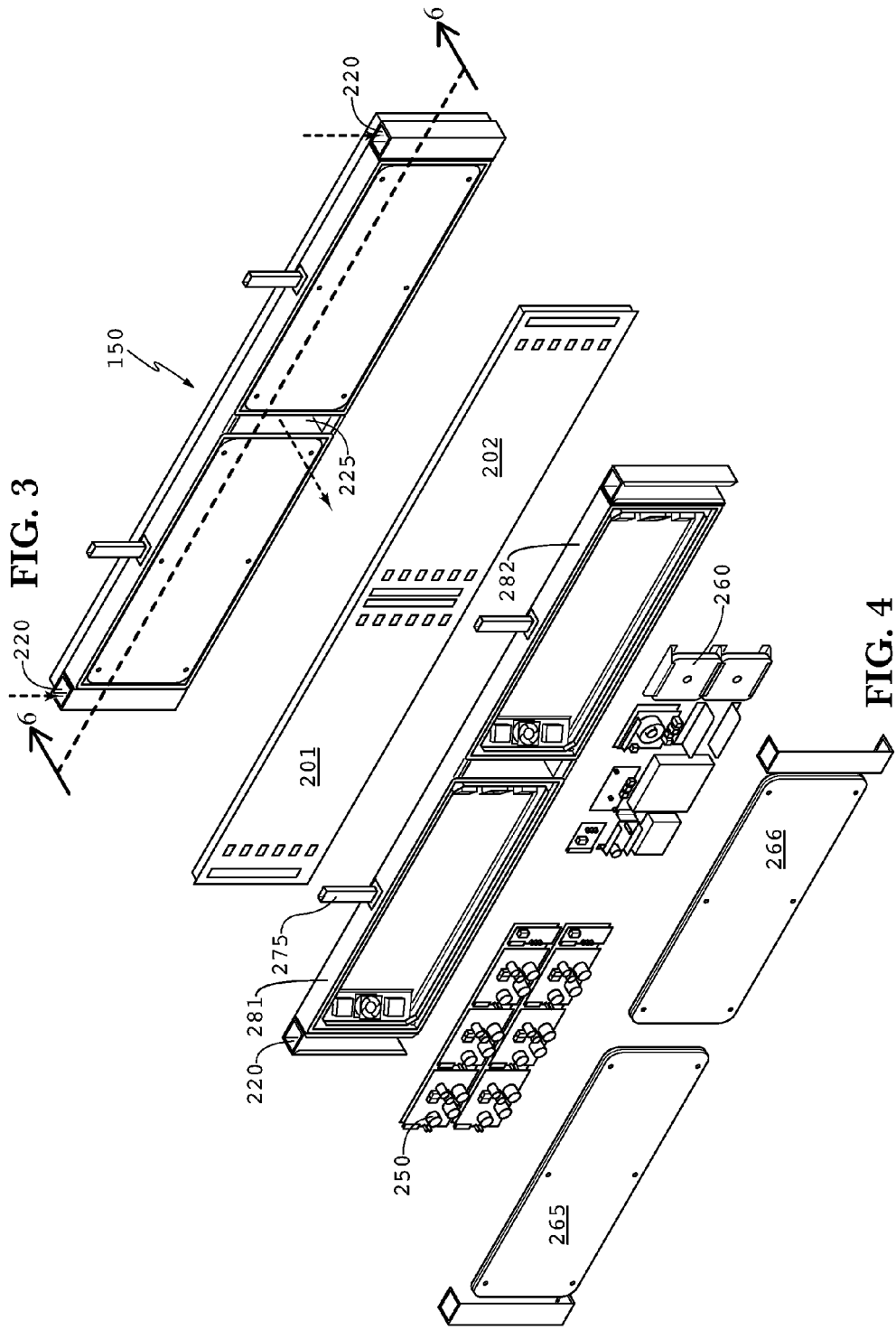

HEAT EXCHANGER ASSEMBLY FOR AN ELECTRONIC DISPLAY

CROSS-REFERENCE TO RELATED APPLICATIONS

This application claims priority to U.S. Provisional Application No. 61/791,421 filed on Mar. 15, 2013 and herein incorporated by reference in its entirety.

TECHNICAL FIELD

The disclosed embodiments of the present invention relate to an assembly for removing the heat generated by an electronic display.

BACKGROUND OF THE ART

Electronic displays are now being used in outdoor environments where high ambient temperatures and direct solar loading can cause the display to malfunction due to excess heat.

SUMMARY OF THE EXEMPLARY EMBODIMENTS OF THE INVENTION

The exemplary embodiments disclosed herein provide a heat exchanger assembly for cooling power module bricks, having a plurality of heat exchanger layers where a top layer is in conductive thermal communication with the power module brick. A series of metallic plates are preferably positioned within each heat exchanger layer and are preferably aligned with the power module brick. A circulating fan may be positioned to force circulating gas across the power module brick and through the heat exchanger. An external air fan may be positioned to force external air through the heat exchanger. Pass through junctions may be positioned near edges of the heat exchanger to permit the circulating gas to cross paths with the external air without allowing the two gas flows to mix with one another.

This and other unmet advantages are provided by the device and method described and shown in more detail below.

BRIEF DESCRIPTION OF THE DRAWINGS

A better understanding of the disclosed embodiments will be obtained from a reading of the following detailed description and the set of accompanying drawings.

FIG. 1 provides a perspective view of an exemplary electronic display assembly.

FIG. 2 provides a perspective view of the electronic display subassembly after being removed from the assembly shown in FIG. 1.

FIG. 3 provides a perspective view of the electronics and power subassembly after being removed from the assembly shown in FIG. 1 and illustrates the horizontal section line 6-6.

FIG. 4 provides an exploded view of the electronics and power subassembly shown in FIG. 3.

DETAILED DESCRIPTION OF A PREFERRED EMBODIMENT

Figure 5:
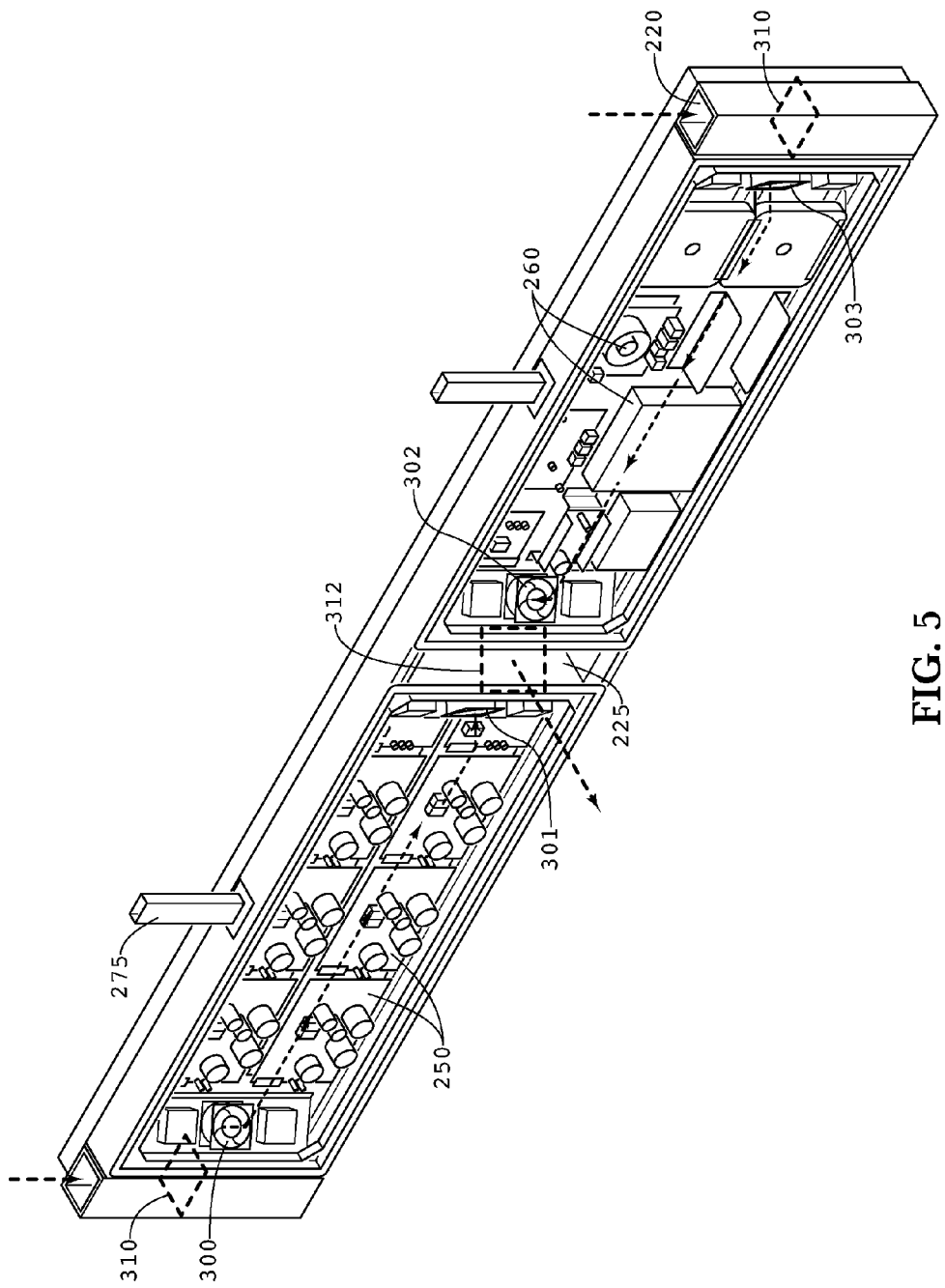
FIG. 5 provides a perspective view of the electronics and power subassembly shown in FIG. 3 after removing the cover doors.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 provides a perspective view of an exemplary electronic display assembly having a housing containing an electronic display subassembly 100 and an electronics and power subassembly 150. In an exemplary embodiment, the housing would have two separate flows of external air flowing through the housing. The first is shown in this figure where external air is ingested at the apertures 50 and is exhausted from the aperture 75.

FIG. 2 provides a perspective view of the electronic display subassembly 100 after being removed from the assembly shown in FIG. 1. The electronic display 120 preferably has a pathway for external air running behind the display 120, this would provide the second flow of external air for an exemplary embodiment. In an exemplary embodiment, the inlet apertures 170 are positioned above the display and are in gaseous communication with a gap 140 behind the display, which ultimately connects with an exhaust aperture 180 positioned below the display. The gap 140 may be created by placing a surface or plate 140 behind the rear surface of the electronic display 120. One or more fans 110 may be positioned to draw the external air through the inlet 170, gap 140, and exhaust 180.

The electronic display can be any variety of electronic display 120, including but not limited to liquid crystal display (LCD), LED, OLED, plasma, electroluminescent polymers, field emission display, and laser video displays. In an exemplary embodiment the electronic display 120 would comprise an LED backlit LCD where the rear surface of the electronic display 120 would be the rear surface of the LED backlight.

FIG. 3 provides a perspective view of the electronics and power subassembly 150 after being removed from the assembly shown in FIG. 1 and illustrates the horizontal section line 6-6. A pair of inlet apertures 220 are preferably in gaseous communication with the inlet apertures 50 in the housing to supply external air to the assembly. This ingested external air is preferably exhausted through the exhaust aperture 225, which aligns with the exhaust aperture 75 in the housing.

FIG. 4 provides an exploded view of the electronics and power subassembly 150 shown in FIG. 3. A first plenum enclosure is preferably created by the plenum walls 281, heat exchanger 201, and front cover 265. A second plenum enclosure is preferably created by the plenum walls 282, heat exchanger 202, and front cover 266. One or more power assemblies or power modules 250 may be placed within the first plenum enclosure. One or more electronic assemblies 260 may be placed within the second plenum enclosure. In an exemplary embodiment, the two plenum enclosures are substantially sealed, and do not accept external air, dust, or other contaminates other than the flow of external air described herein (which preferably would not enter the plenum enclosures, but would only flow through the heat exchangers 201 and 202 as described below).

Further, in an exemplary embodiment, the power modules 250 would be considered high voltage/high power electronics while the electronic assemblies 260 would be considered low voltage/low power electronics and these would be isolated into their own respective plenums. Generally speaking, the electronic assemblies 260 would include, but would not be limited to: hard drives, video players, microprocessors, wireless/satellite antennas, and CPU's. A wiring conduit 275 may provide wiring access into the plenums but should be substantially sealed so as not to allow contaminates or external air to enter the plenum through the wiring conduit 275. The wiring conduit 275 may provide the electrical communication between the low power and high power electronics and also between the low/high power electronics and the electronic display 120.

FIG. 5 provides a perspective view of the electronics and power subassembly shown in FIG. 3 after removing the cover doors 265 and 266. A fan 310 may be placed in the inlet tube to draw the external air through the inlets, heat exchanger, and exhaust aperture 225. Alternatively, a fan 312 could be placed near the exhaust aperture 225. In some embodiments, both fans 310 and fan 312 may be used. In the first plenum, fans 300 and 301 are used to force a closed loop circulating gas through the plenum and heat exchanger 201. In the second plenum, fans 302 and 303 are used to force a closed loop circulating gas through the plenum and heat exchanger 202. Of course, in some embodiments only a single fan for each closed loop of circulating gas may be used rather than the pairing of fans shown herein.

Figure 6:
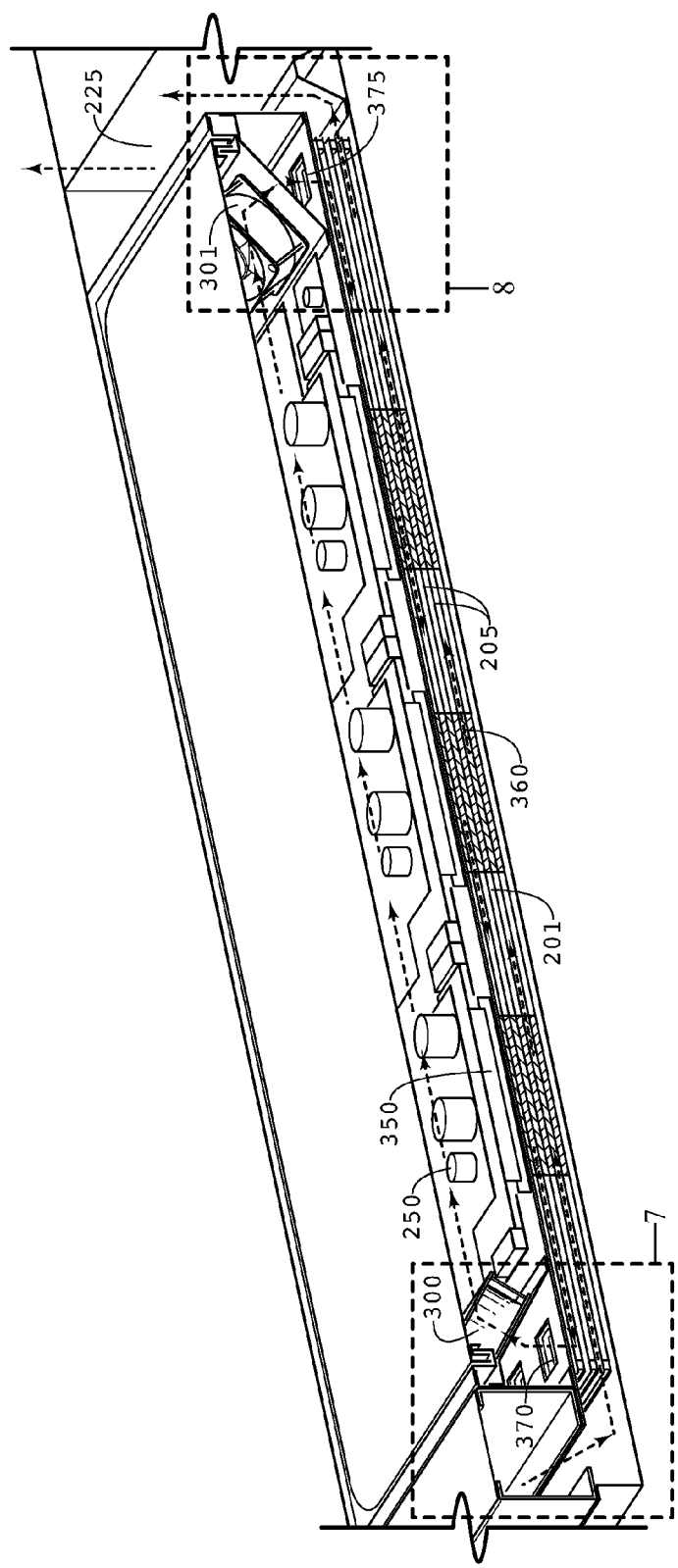
FIG. 6 provides a section view of the electronics and power subassembly shown in FIG. 3, taken along the section line 6-6.

FIG. 6 provides a section view of the electronics and power subassembly 150 shown in FIG. 3, taken along the section line 6-6. Each power module 250 is preferably placed in conductive thermal communication with the heat exchanger 201. In an exemplary embodiment, the power brick 350 is preferably in conductive thermal communication with the heat exchanger 201, which is comprised of a plurality of layers 205, where the space in between each layer defines a gaseous pathway. In an exemplary embodiment, a metallic plate 360 is preferably placed between each layer 205 of the heat exchanger 201, and is positioned adjacent to the areas containing a power brick 350. The layers 205 of the heat exchanger 201 may be metallic or plastic (sometimes corrugated plastic or corrugated metal as shown in the Figures) or any combination of these materials. The heat exchangers 201 and 202 are preferably counterflow heat exchangers.

In an exemplary embodiment, the length and width of the metallic plates 360 are substantially the same as the length and width of the power bricks 350, however this is not required. Ideally, a series of metallic plates 360 may be aligned with each brick 350, such that a layer 205 of the heat exchanger is placed between the brick 350 and the first plate 360, as well as between each subsequent plate 360. While it may not be necessary to place a metallic plate 360 between every heat exchanger layer 205, this may be done in an exemplary embodiment. Each metallic plate 360 may be sandwiched between the layers 205 and may be held in place with adhesive.

The external air is forced through the heat exchanger 201 and exhausted out of the exhaust aperture 225. In this way, heat from the power module 250 may be transferred to the brick 350 and eventually to the plates 360 and heat exchanger layers 205 through conductive heat transfer. The external air removes heat from these assemblies as it passes through the heat exchanger 201.

Additionally, closed loop circulating gas is also travelling through the pathways of the heat exchanger 201, where the gas pathways may be defined as the space between heat exchanger layers 205. The layers 205 may be space apart based on the thickness of the plates 360, and held with this spacing once assembled around the plates 360. In this embodiment, the closed loop of circulating gas is forced around the closed loop by the pair of fans 300 and 301. The loop may be described as beginning at fan 301, traversing the pass through junction 375, travelling through the heat exchanger 201, traversing the pass through junction 370, passing the fan 300, and travelling across the power modules 250 before returning to the fan 301. The gas pathways alternate, where a pathway accepting circulating gas would be adjacent to a pathway accepting external air which is in turn adjacent to another pathway accepting circulating gas. Preferably, the circulating gas and external air are not permitted to mix with one another. However, as the two gases travel through their pathways, heat from the circulating gas can be transferred to the external air and removed from the display housing through the exhaust.

The opposing heat exchanger 202 is setup in a similar fashion as the heat exchanger 201 described above. The only difference would be that heat exchanger 202 would not contain the bricks 350, which are generally not used for the low power/voltage electronics 260. However, the metallic plates 360 may be used in the heat exchanger 202, in order to pull heat from the electronics 260 into the heat exchanger 202 for removal by the external air.

Figure 7:
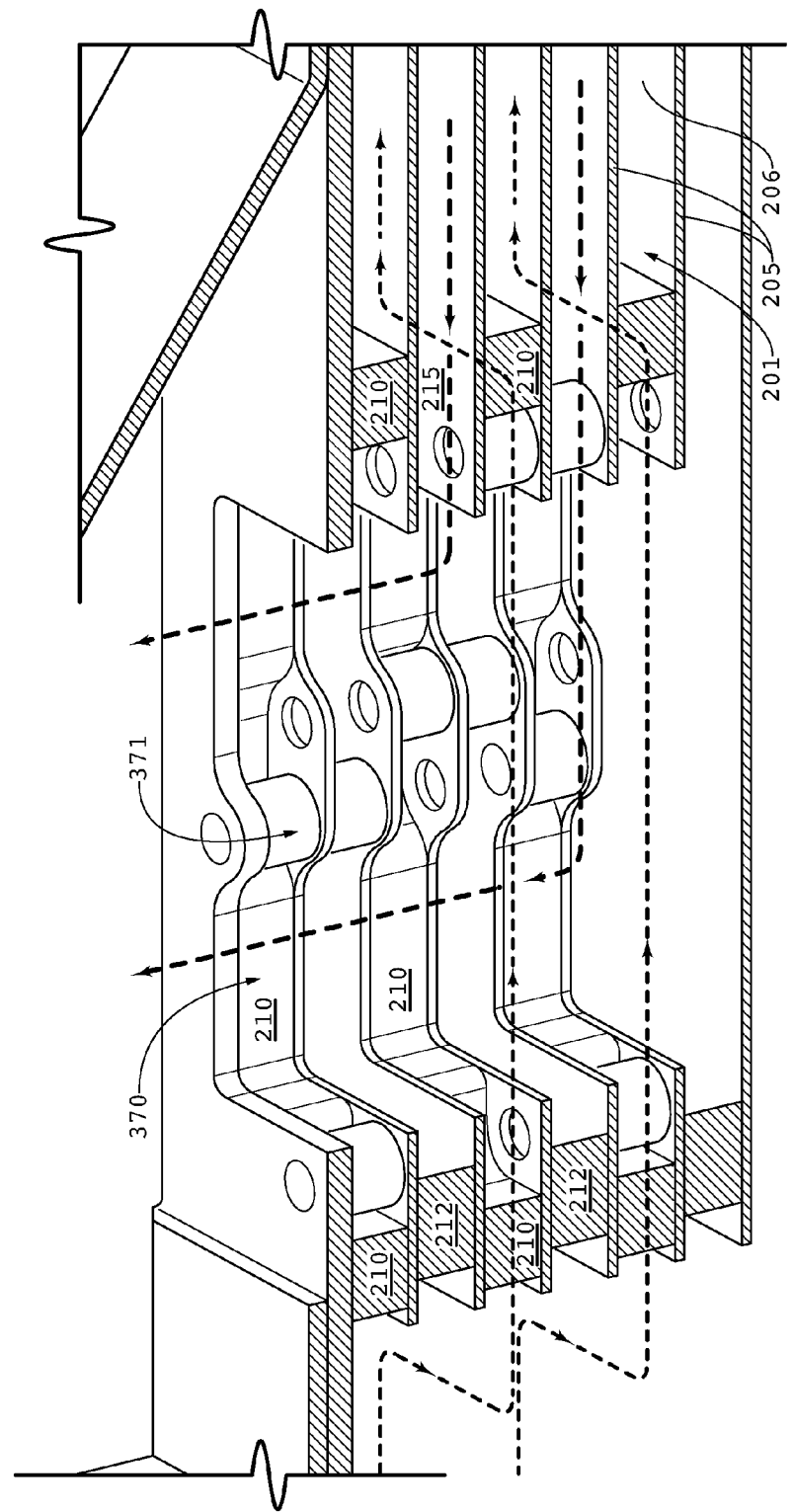
FIG. 7 provides a detailed section view of DETAIL 7, shown in FIG. 6 where a second section has been taken vertically through the center of the pass through junctions.

FIG. 7 provides a detailed section view of DETAIL 7, shown in FIG. 6, where a second section has been taken vertically through the center of the pass through junctions. Here, the details of an exemplary pass through junction 370 are shown. Generally, the pass through junction 370 is placed near the end of the heat exchanger 201. Initially, note the blocking elements 212 which are positioned within each pathway 206 which contains the closed loop circulating gas. These blocking elements 212 run the entire length of the heat exchanger 201, to prohibit external air from entering the circulating gas pathways. Also note the cutout opening 371 in the heat exchanger which preferably passes through several, if not every layer 205 of the heat exchanger. While a blocking element 212 may be placed adjacent to the opening 371 on the end of the heat exchanger, the opposing side of the opening 371 is preferably free of any blocking so that the pathways 215 which accept circulating gas can provide gaseous communication through the opening 371 to continue the circulating closed loop path.

A series of donut gaskets 210 may be placed within each pathway 206 which accepts external air, such that the donut gasket 210 substantially surrounds and seals off the pathway 206 from the opening 371. In this way, external air traveling through the heat exchanger is permitted to flow through the pathway 206, but is not permitted to enter the opening 371 or mix with the circulating gas. The donut gaskets 210 do not preferably run the entire length of the heat exchanger, but would only surround the openings 371, which could be any shape but are typically found as rectangles, squares, circles, ovals, or some combination of these. The interior dimensions of the donut gaskets 210 preferable match that of the cutout 371. However, the exterior dimensions of the donut gaskets 210 can vary.

Although not required, it is preferable that the donut gaskets 210 are comprised of a compressible material, preferably an elastomer or rubber of some type, but soft and compressible materials have been found to provide acceptable results. In some embodiments, the donut gaskets 210 can simply comprise a sheet of compressible material having a void removed from the center, where that void can have any shape, including but not limited to any polygon, circle, or oval shape. Preferably, the donut gaskets 210 would have a continuous perimeter surrounding the void, which is preferably aligned with the opening 371, so that external air is not permitted to enter the opening 371, but can still travel through the pathway 206.

Figure 8:
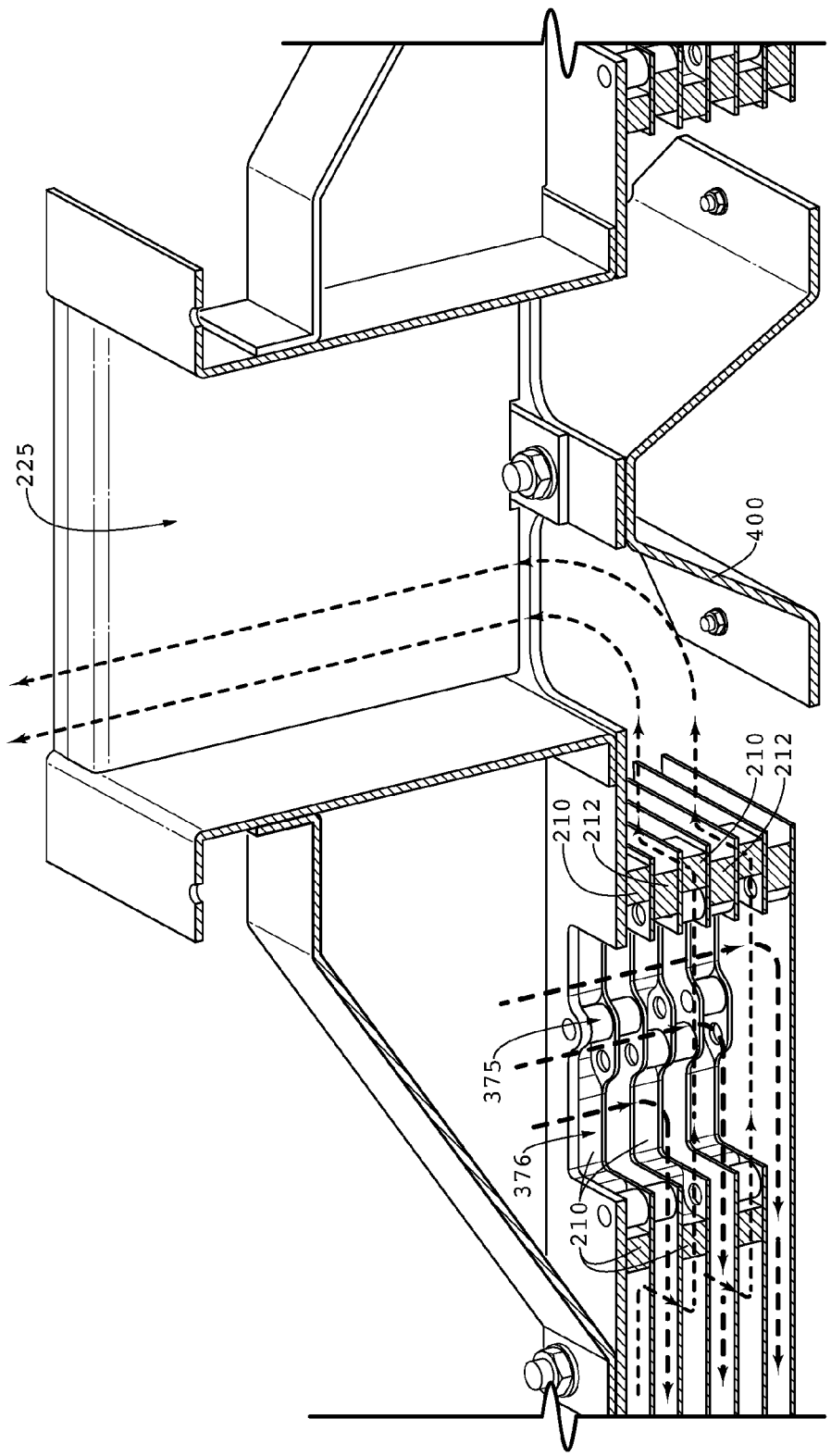
FIG. 8 provides a detailed section view of DETAIL 8, shown in FIG. 6 where a second section has been taken vertically through the center of the pass through junctions.

FIG. 8 provides a detailed section view of DETAIL 8, shown in FIG. 6, where a second section has been taken vertically through the center of the pass through junctions. Here, the details of an exemplary opposing pass through junction 375 are shown. Again, the opposing pass through junction 375 is preferably placed near the end/edge of the heat exchanger 201. Also, again note the blocking elements 212 which are positioned within each pathway 206 which contains the closed loop circulating gas. These blocking elements 212 run the entire length of the heat exchanger 201, to prohibit external air from entering the circulating gas pathways. Also note the cutout opening 376 in the heat exchanger which preferably passes through several, if not every layer 205 of the heat exchanger. While a blocking element 212 may be placed adjacent to the opening 376 on the end of the heat exchanger, the opposing side of the opening 376 is preferably free of any blocking so that the pathways 206 which accept circulating gas can provide gaseous communication through the opening 376 to continue the circulating closed loop path.

A series of donut gaskets 210 may again be placed within each pathway 206 which accepts external air, such that the donut gasket 210 substantially surrounds and seals off the pathway 206 from the opening 376. In this way, external air traveling through the heat exchanger is permitted to flow through the pathway 206, but is not permitted to enter the opening 376 or mix with the circulating gas. Here, the external air would travel around the donut gasket 210, eventually exiting the heat exchanger and exhausting out of the exhaust aperture 225.

An angled redirection plate 400 is preferably placed after the heat exchanger and adjacent to the exhaust aperture 225 in order to change the direction of the external air approximately 90 degrees, or in other words to direct it towards the exhaust aperture 225.

Another pair of pass through junctions with their own gasket donuts and blocking elements are preferably used for the opposing side of the assembly, which houses the electronics 260. The design could be substantially the same, however in some embodiments it may be possible to use a smaller heat exchanger or perhaps one with fewer layers, as there may be less heat generated by the electronics 260 when compared to the power modules 250. There could also be fewer fans used on this side of the assembly as well.

It should be noted that the term circulating gas does not require a 'pure' gas but could be any gaseous matter (which could of course be a mixture of various types of gases and even small amounts of contaminate, but the circulating gas would preferably have only a minimal amount of contaminates, and most preferably would be free of particulate and contaminates).

Having shown and described a preferred embodiment of the invention, those skilled in the art will realize that many variations and modifications may be made to affect the described invention and still be within the scope of the claimed invention. Thus, many of the elements indicated above may be altered or replaced by different elements which will provide the same result and fall within the spirit of the claimed invention. It is the intention, therefore, to limit the invention only as indicated by the scope of the claims.

What is claimed is:

1. A heat exchanger assembly for cooling power modules having bricks, the assembly comprising:
    a plurality of heat exchanger layers where a top layer is placed in conductive thermal communication with the power module brick;
    a metallic plate positioned between each heat exchanger layer and adjacent to the power module brick;
    blocking elements placed between alternating pairs of layers along opposing edges of the heat exchanger to define closed loop pathways;
    a cutout placed near the edges of the heat exchanger that contain the blocking elements;
    a donut gasket surrounding each cutout and placed only within pathways which are not closed loop pathways;
    a closed loop fan positioned to force a closed loop of circulating gas through the closed loop pathways, both cutouts, and along the power modules; and
        an external air fan positioned to force external air through the alternating heat exchanger layers that are not closed loop pathways;
    wherein the heat exchanger is configured such that external air and circulating gas will be circulated through alternating layers of the heat exchanger.

2. The heat exchanger assembly of claim 1 wherein:
    the power module brick is in conductive thermal communication with the top layer of the heat exchanger, and where the top layer of the heat exchanger is also in conductive thermal communication with the metallic plate.

3. The heat exchanger assembly of claim 1 wherein:
    the blocking elements run the entire length of the heat exchanger.

4. The heat exchanger of claim 1 wherein:
    the external air is not permitted to mix with the circulating gas.

5. The heat exchanger assembly of claim 1 wherein:
    the heat exchanger layers are comprised of corrugated plastic.

6. The heat exchanger of claim 1 wherein:
    the heat exchanger layers are comprised of metal.

7. A heat exchanger assembly for cooling power modules having bricks, the assembly comprising:
    a plurality of heat exchanger layers placed within a plenum where an outer layer is placed in conductive thermal communication with the power module brick;
    a plurality of gaseous pathways defined by the space between each layer where the pathways alternate between an external air pathway that carries air from outside of the plenum, and a circulating gas pathway that carries a closed loop gas from inside the plenum;
    blocking elements placed within entrances to the circulating gas pathways;
    a cutout passing through several layers of the heat exchanger and placed adjacent to the blocking elements;
    a gasket sounding the cutout and placed only within external air pathways;
    a metallic plate positioned within each pathway and adjacent to the power module brick;
    an external air fan positioned to force external air through the external air pathways; and
    a circulating fan positioned to force circulating gas through the circulating gas pathways.

8. The heat exchanger assembly of claim 7 wherein:
    the circulating gas travels in a closed loop and does not mix with the external air.

9. The heat exchanger assembly of claim 7 wherein:
    the power module brick is in conductive thermal communication with the outer layer of the heat exchanger, and where the outer layer of the heat exchanger is also in conductive thermal communication with the metallic plate.

10. The heat exchanger assembly of claim 7 wherein:
    the blocking elements are placed along edges of the circulating gas pathways.

11. An assembly for cooling an electronic display having high power electrical assemblies and low power electrical assemblies, the cooling assembly comprising:
    a first sealed plenum containing the high power electrical assemblies and a first heat exchanger;
    a first circulating fan positioned for force circulating gas through the first heat exchanger and across the high power electrical assemblies;
    a second sealed plenum containing the low power electrical assemblies and a second heat exchanger;
    a second circulating fan positioned to force circulating gas through the second heat exchanger and across the low power electrical assemblies;
    a first external fan positioned to draw external air through the first heat exchanger; and
    a second external fan positioned to draw external air through the second heat exchanger.

12. The cooling assembly of claim 11 wherein the first heat exchanger comprises:
    a plurality of heat exchanger layers where a top layer is placed in conductive thermal communication with the high power electrical assemblies.

13. The cooling assembly of claim 12 further comprising:
    a metallic plate positioned between each heat exchanger layer and aligned with each of the high power electrical assemblies.

14. An assembly for cooling an electronic display having a power module brick and a video player, the cooling assembly comprising:
    a housing containing the electronic display, power module brick, and a video player;
    a first inlet aperture along an edge of the housing;
    a second inlet aperture along an edge of the housing opposing the first inlet aperture;
    an exhaust aperture placed near a center of the housing;
    a portion of the housing which is placed behind the electronic display to define a gap;
    a display fan positioned to force external air through the gap;
    a first sealed plenum containing the power module brick and a first heat exchanger;
    a first circulating fan positioned for force circulating gas through the first heat exchanger and across the power module brick;
    a second sealed plenum containing the video player and a second heat exchanger;
    a second circulating fan positioned to force circulating gas through the second heat exchanger and across the video player;

a first external fan positioned to draw external air through the first inlet aperture, first heat exchanger, and exhausted through the exhaust aperture;

a second external fan positioned to draw external air through the second inlet aperture, second heat exchanger, and exhausting out of the exhaust aperture; and a series of metallic plates positioned within the first heat exchanger and substantially aligned with the power module brick.

15. The cooling assembly of claim 14 wherein the first heat exchanger comprises:

a plurality of heat exchanger layers where a top layer is placed in conductive thermal communication with the power module brick.

16. The cooling assembly of claim 15 further comprising:

a metallic plate positioned between each heat exchanger layer and adjacent to the power module brick.

\* \* \* \* \*

UNITED STATES PATENT AND TRADEMARK OFFICE
CERTIFICATE OF CORRECTION

PATENT NO. : 9,648,790 B2  
APPLICATION NO. : 14/198141  
DATED : May 9, 2017  
INVENTOR(S) : William Dunn et al.

Page 1 of 1

It is certified that error appears in the above-identified patent and that said Letters Patent is hereby corrected as shown below:

In the Specification

In Column 1, Lines 7-9, please delete "This application claims priority to U.S. Provisional Application No. 61/791,421 filed on Mar. 15, 2013 and herein incorporated by reference in its entirety." and insert -- This application claims the benefit of U.S. Provisional Application No. 61/791,421, filed on March 15, 2013, which is hereby incorporated by reference as if fully recited herein. --.

In Column 3, Line 38, please delete "plate 140 behind" and insert -- plate behind --.

In the Claims

In Column 7, Line 64, please delete "a gasket sounding the cutout" and insert -- a gasket surrounding the cutout --.

Signed and Sealed this  
Twentieth Day of June, 2017

Joseph Matal  
*Performing the Functions and Duties of the*  
*Under Secretary of Commerce for Intellectual Property and*  
*Director of the United States Patent and Trademark Office*